US010945359B2

(12) United States Patent
Teshima et al.

(10) Patent No.: US 10,945,359 B2
(45) Date of Patent: Mar. 9, 2021

(54) COMPONENT TRANSFER DEVICE

(71) Applicant: FUJI CORPORATION, Chiryu (JP)

(72) Inventors: Chikashi Teshima, Okazaki (JP); Kazuma Hattori, Aisai (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/487,618

(22) PCT Filed: Feb. 28, 2017

(86) PCT No.: PCT/JP2017/007972
§ 371 (c)(1),
(2) Date: Aug. 21, 2019

(87) PCT Pub. No.: WO2018/158855
PCT Pub. Date: Sep. 7, 2018

(65) Prior Publication Data
US 2019/0387654 A1    Dec. 19, 2019

(51) Int. Cl.
*H05K 13/04* (2006.01)
*H05K 13/02* (2006.01)
*H05K 13/08* (2006.01)

(52) U.S. Cl.
CPC ......... *H05K 13/0409* (2018.08); *H05K 13/02* (2013.01); *H05K 13/0452* (2013.01); *H05K 13/08* (2013.01)

(58) Field of Classification Search
CPC ..... A47L 5/16; A47L 9/02; A47L 5/28; A47L 9/14; A47L 9/0673; A47L 9/106; A47L 9/00; A47L 9/32; A47L 13/256; A47L 9/12
See application file for complete search history.

(56) References Cited

U.S. PATENT DOCUMENTS

2016/0066484 A1    3/2016  Arai

FOREIGN PATENT DOCUMENTS

| JP | 2001-267796 A | 9/2001 |
|----|---------------|--------|
| JP | 2012-235056 A | 11/2012 |
| WO | WO 2014/207907 A1 | 12/2014 |

OTHER PUBLICATIONS

International Search Report dated May 30, 2017 in PCT/JP2017/007972 filed on Feb. 28, 2017.

*Primary Examiner* — David Redding
(74) *Attorney, Agent, or Firm* — Oblon, McClelland, Maier & Neustadt, L.L.P.

(57) ABSTRACT

A component transfer device including: a component mounting tool mounted on a movable mounting head, the component mounting tool being configured to collect a component from a component supply device and mount the component on a board; a side imaging section configured to image the component held by the component mounting tool from the side; a cleaning nozzle having an emission port on a side surface only of the cleaning nozzle that opens toward the side imaging section; and a positive pressure air supply section configured to supply positive pressure air to the cleaning nozzle and blow out the positive pressure air from the emission port toward the side imaging section.

5 Claims, 8 Drawing Sheets

COMPONENT TRANSFER DEVICE

TECHNICAL FIELD

The present specification relates to a component transfer device that is mainly loaded on a component mounter and that transfers an electronic component (hereinafter referred to as a component) from a component supply device to a board.

BACKGROUND ART

Techniques for mass production of circuit boards by performing various operations for mounting components on printed wiring boards (hereinafter referred to as board operations) have become widespread. Examples of board work machines for performing the board work include solder printers, component mounters, reflow ovens, and board inspection machines. It is common to configure a component mounting line by connecting these board work machines. Component mounters usually include a board conveyance device, a component supply device, and a component transfer device.

The component transfer device includes a component mounting tool for collecting components and mounting them on a board, and a head drive mechanism for moving a mounting head equipped with the component mounting tool. Examples of the component mounting tool include a suction nozzle for picking up a component using negative pressure, and a clamping type mounting tool for clamping the component. In order to check a component by imaging the component held by the component mounting tool from below, an upward-facing imaging unit is often provided on the machine base, and further, in order to image and check a component held by the component mounting tool from the side, a side imaging unit may be provided on the mounting head. An example of technology of a component transfer device having a side imaging unit is disclosed in patent literature 1.

The side image acquisition device of patent literature 1 images a nozzle holder that rotatably holds multiple suction nozzles, and side images of components held by two of the suction nozzles are introduced into one side imaging camera through a first optical path and a second optical path, and two side images, one large and one small, are captured in one go. According to this, it is supposed that a height measurement, a posture confirmation, and a determination of whether the component is upside-down can be performed with the large side image, and the presence or absence of the component can be determined with the small side image.

CITATION LIST

Patent Literature

Patent literature 1: JP-A-2001-267796

BRIEF SUMMARY

Technical Problem

However, when the component transfer device repeatedly collects components and mounts them on boards, dust gradually adheres to the side imaging section. For example, paper dust is generated from a carrier tape used by the component supply device, and the paper dust adheres to the side imaging section to block a portion of the optical path. This means the quality of the image data acquired by the imaging gradually decreases. As a result, there is a danger of an image processing error in which a component cannot be checked even if image processing is performed on image data. In order to prevent an image processing error in advance, conventionally, maintenance is performed in which the component mounter is periodically stopped and the side imaging section is manually cleaned using a cotton swab or the like.

It is an object of the present disclosure to provide a component transfer device capable of reducing maintenance work for manually cleaning a side imaging section.

Solution to Problem

Disclosed herein is a component transfer device including: a component mounting tool mounted on a movable mounting head, the component mounting tool being configured to collect a component from a component supply device and mount the component on a board; a side imaging section configured to image the component held by the component mounting tool from the side; a cleaning nozzle having an emission port on a side surface only of the cleaning nozzle that opens toward the side imaging section; and a positive pressure air supply section configured to supply positive pressure air to the cleaning nozzle and blow out the positive pressure air from the emission port toward the side imaging section.

Advantageous Effects

According to a component transfer device disclosed in this specification, a positive pressure air supply section blows positive pressure air from an emission port of a cleaning nozzle toward a side imaging unit. Since the blown positive pressure air blows off dust adhering to the side imaging section, cleaning of the side imaging section is performed automatically. Therefore, maintenance work for manually cleaning the side imaging section is reduced.

DESCRIPTION OF EMBODIMENTS

1. Overall Configuration of Component Mounter 9

Figure 1:
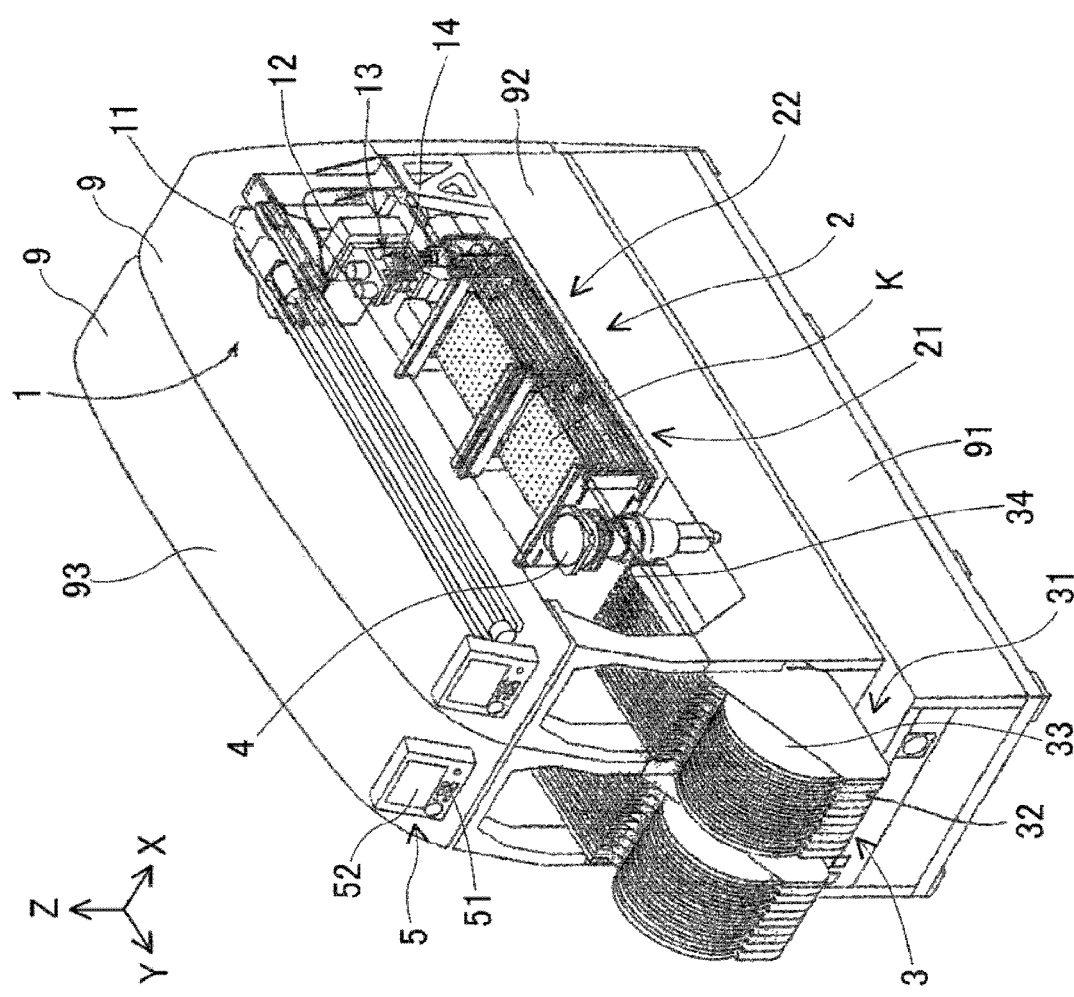
FIG. 1 is a perspective view showing the overall configuration of a component mounter on which is loaded a component transfer device according to an embodiment.

Component transfer device 1 of an embodiment will be described with reference to FIGS. 1 to 8. FIG. 1 is a perspective view showing the overall configuration of a component mounter on which is loaded a component transfer device according to an embodiment. In FIG. 1, two component mounters 9 of the same type are disposed on shared base 91. Component mounter 9 is configured by assembling board conveyance device 2, component supply device 3, component transfer device 1, component camera 4, control section 5, and the like to machine base 92. In the figure, the X-axis direction is a direction in which the boards K are loaded and unloaded, the Y-axis direction is a direction perpendicular to the X-axis direction in the horizontal plane, and the Z-axis direction is a vertical direction.

Board conveyance device 2 is disposed on an upper surface of machine base 92 in the vicinity of the center in the longitudinal direction (Y-axis direction) of component mounter 9. The board conveyance device 2 is a so-called double lane type device in which a first conveyance device 21 and a second conveyance device 22 are arranged in parallel. First conveyance device 21 has a pair of guide rails that are parallel to the X-axis direction, a pair of conveyor belts (not shown) that are guided by the guide rails and convey the boards K that is loaded thereon, and the like. Further, first conveyance device 21 is provided with a clamping device (not shown) for pushing up and positioning the board K conveyed to the mounting position. Second conveyance device 22 is configured in the same manner as first conveyance device 21.

Component supply device 3 is provided on the front side of component mounter 9. Component supply device 3 is composed of multiple detachable cassette feeders 31. Cassette feeder 31 includes main body 32, supply reel 33 provided on the front side of main body 32, and component removal section 34 provided on an upper portion of the rear end of main body 32. Carrier tape in which a large number of components are sealed at a predetermined pitch is wound and held on supply reel 33. The carrier tape is fed at a predetermined pitch by a tape feeding mechanism (not shown). As a result, the sealed state of the components is released and components are sequentially fed to component removal section 34.

Component transfer device 1 is a so-called XY robot-type device that can move in the X-axis direction and the Y-axis direction. Component transfer device 1 is arranged from the rear in the longitudinal direction of component mounter 9 (the upper right side in FIG. 1) to above component supply device 3 at the front. Component transfer device 1 includes head drive mechanism 11, mounting head 12, nozzle holder 13, multiple suction nozzles 14, side imaging section 6 (see FIGS. 2 to 5), cleaning nozzle 7 (see FIGS. 3 to 6), positive pressure air supply section 8 (see FIG. 6), and the like.

Head drive mechanism 11 drives mounting head 12 in the X-axis direction and the Y-axis direction in the horizontal plane. Head drive mechanism 11 can be configured by appropriately adopting various well known techniques. Mounting head 12 rotatably supports nozzle holder 13 on its lower side. Multiple suction nozzles 14 are detachably mounted on nozzle holder 13. Suction nozzle 14 picks up a component from component removal section 34, and mounts the component at a predetermined mounting coordinate position of board K. Component transfer device 1 performs a pickup and mounting cycle by moving to component supply device 3, picking up components using the multiple suction nozzles 14, moving the components to board K via component camera 4, which will be described later, and mounting the components. Further, component transfer device 1 repeats the pickup and mounting cycle to perform mounting operations of components.

Component transfer device 1 has a nozzle changer, which is not shown in FIG. 1. Suction nozzles 14 are exchangeably loaded in each of multiple nozzle loading holes in the nozzle changer. The nozzle changer enables automatic exchanging of the multiple suction nozzles 14 provided on nozzle holder 13. Further, cleaning nozzle 7 is loaded in a nozzle mounting hole of the nozzle changer and can be attached to and removed from nozzle holder 13. The number and the shape of the nozzle loading holes of the nozzle changer can be appropriately changed. The detailed configuration of component transfer device 1 is described later.

Component camera 4 is provided facing upwards on an upper surface of base 92 between board conveyance device 2 and component supply device 3. Component camera 4 captures an image of a state in which the multiple suction nozzles 14 are in the process of picking up components from component removal section 34 and moving the components to board K. As a result, component camera 4 can collectively image components held by the multiple suction nozzles 14. The acquired image data is subjected to image processing, and the pickup state of the component is checked. Further, the pickup state of the component is also checked by side imaging section 6 described later. Upon checking the pickup position of the component, the deviation of the rotation angle, bending of leads, and the like, mounting operation is finely adjusted as necessary. Components that are difficult to mount are discarded.

Control section 5 is disposed at a front portion of cover 93 covering an upper portion of machine base 92. Control section 5 is configured by using a computer device having a CPU and operating by software. Control section 5 includes input section 51 and display section 52 as a man-machine interface. Control section 5 controls mounting operation of the components according to mounting job data set in advance. The mounting job data designates the type, quantity, mounting order, and the like of the components mounted on board K by component mounter 9. Further, the mounting job data also specifies the position of cassette type feeder 31 that holds the component, the mounting coordinate position on board K, the type of suction nozzle 14 used for mounting, and the like.

2. Configuration of Component Transfer Device 1 of an Embodiment

Figure 2:
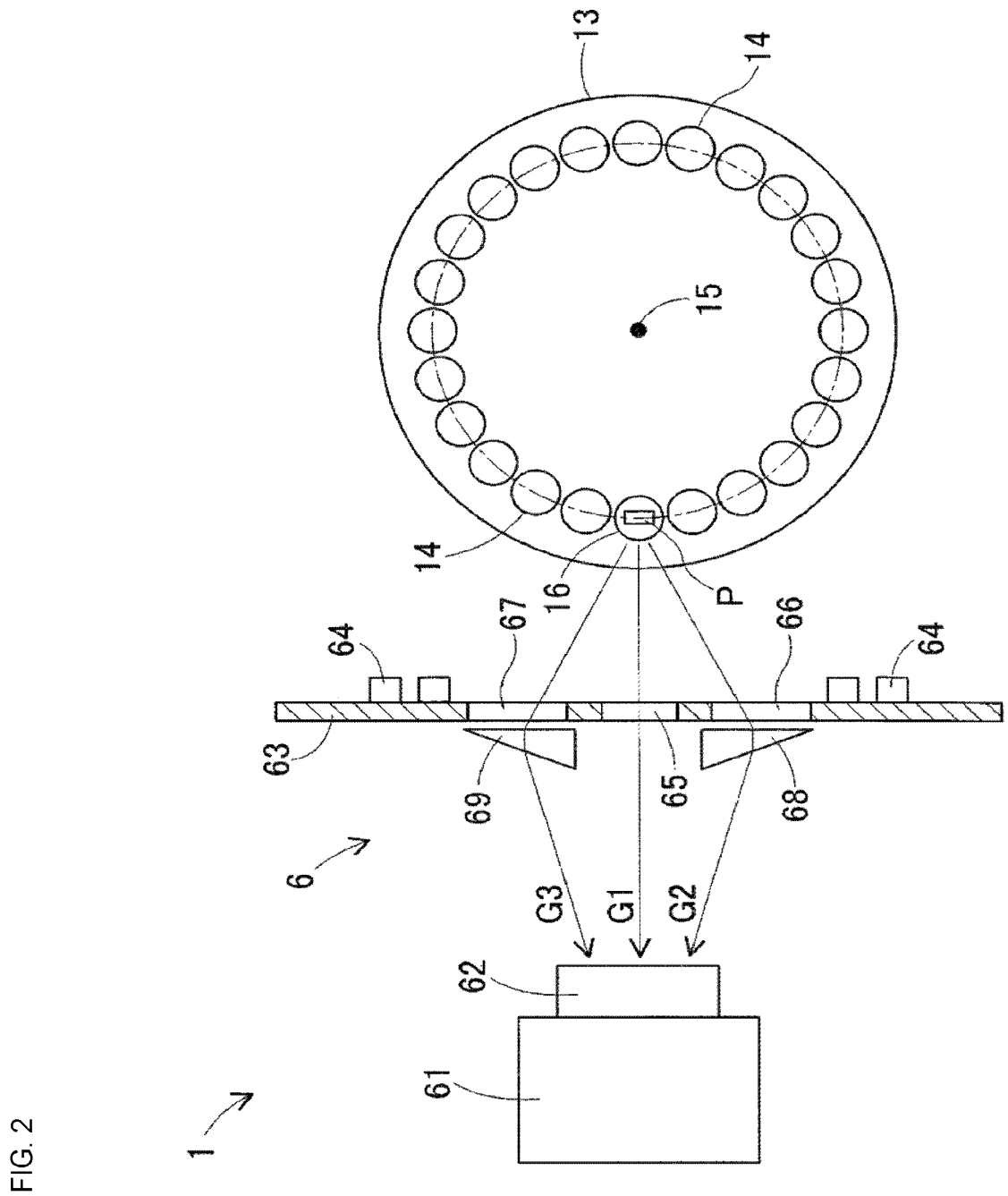
FIG. 2 is a plan view illustrating a nozzle holder and a side imaging section of a component transfer device according to an embodiment.
Figure 3:
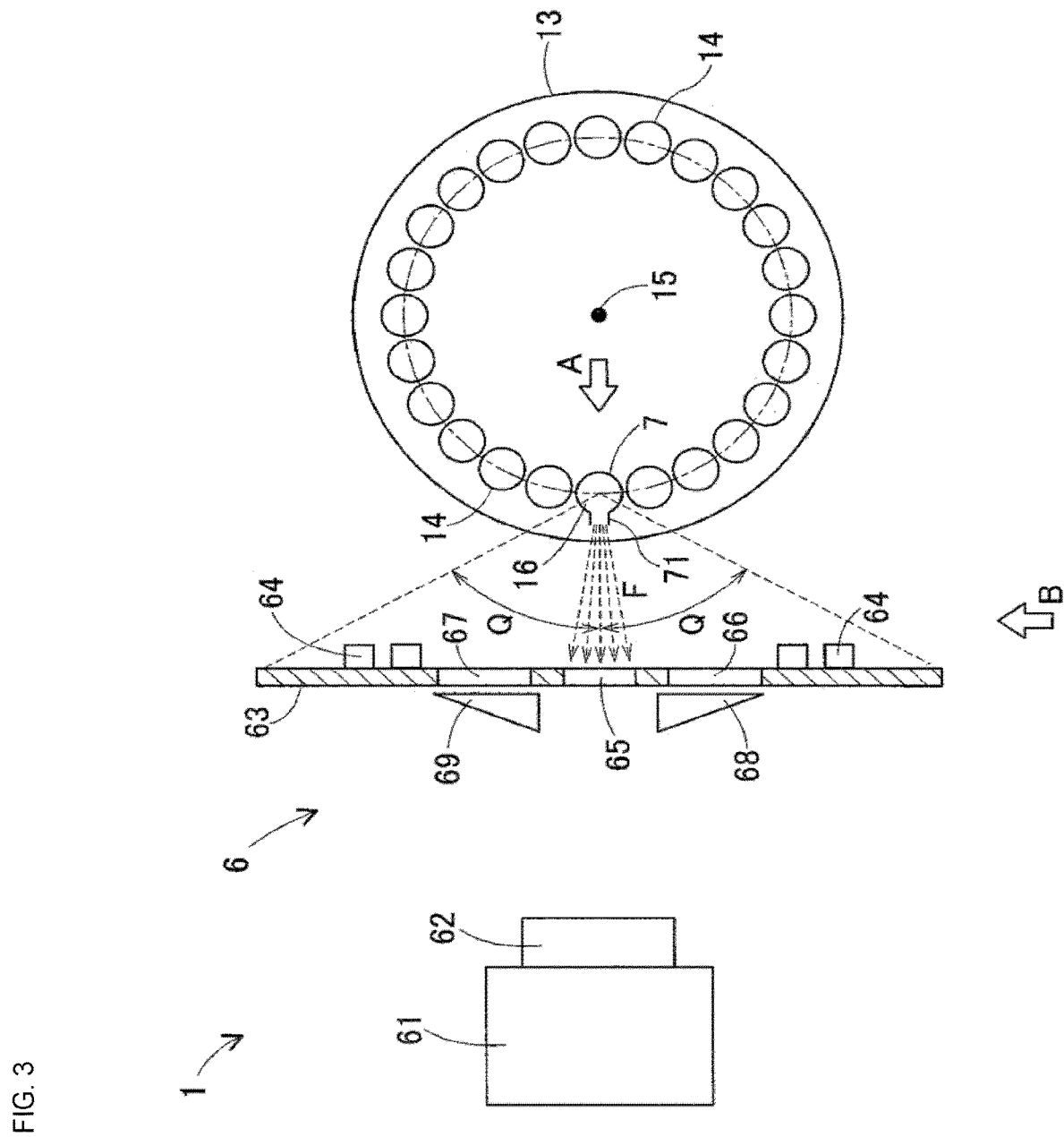
FIG. 3 is a plan view showing a nozzle holder of the component transfer device, a side imaging section, and a cleaning nozzle.
Figure 4:
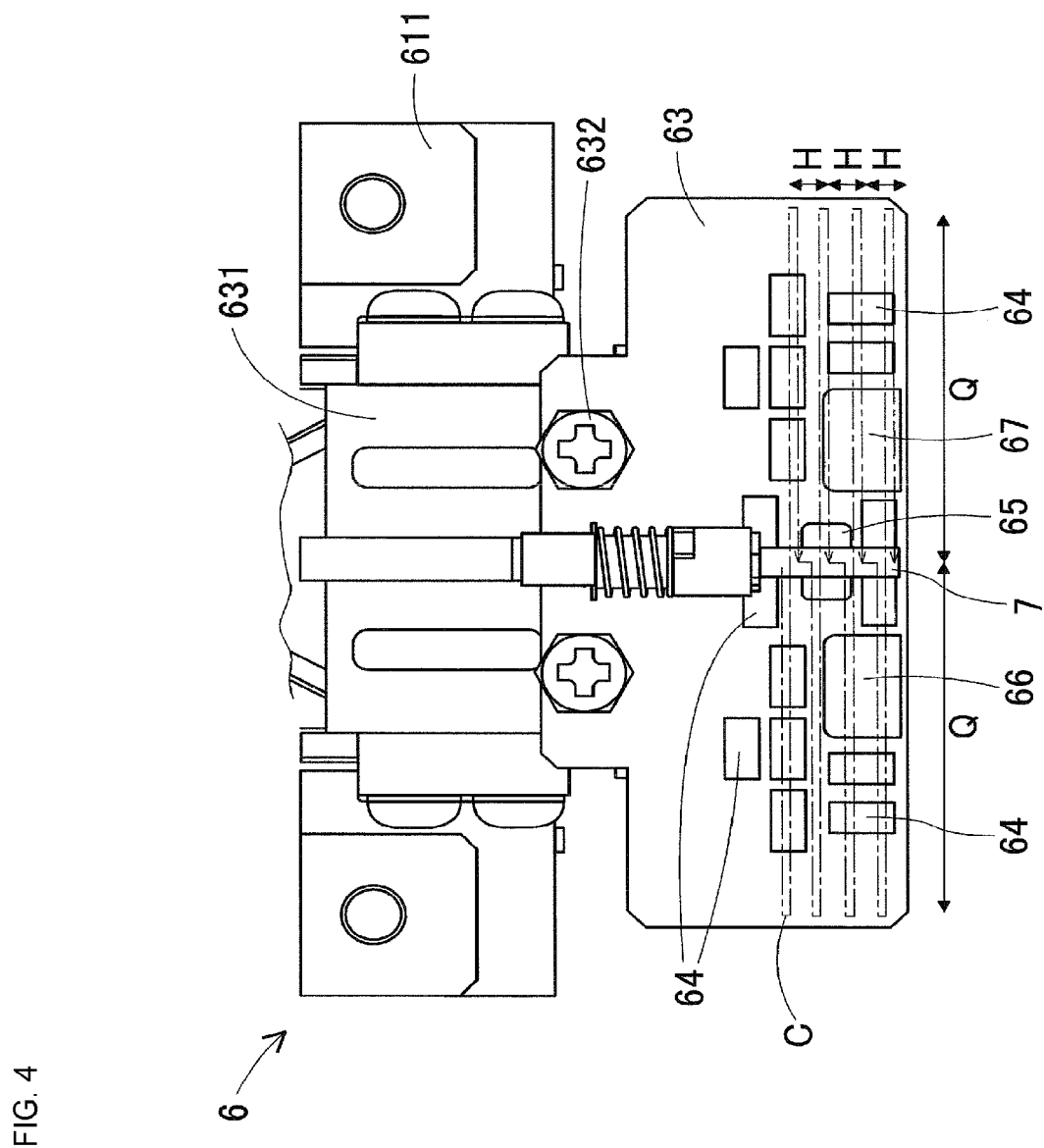
FIG. 4 is a view from the direction of arrow A in FIG. 3.
Figure 5:
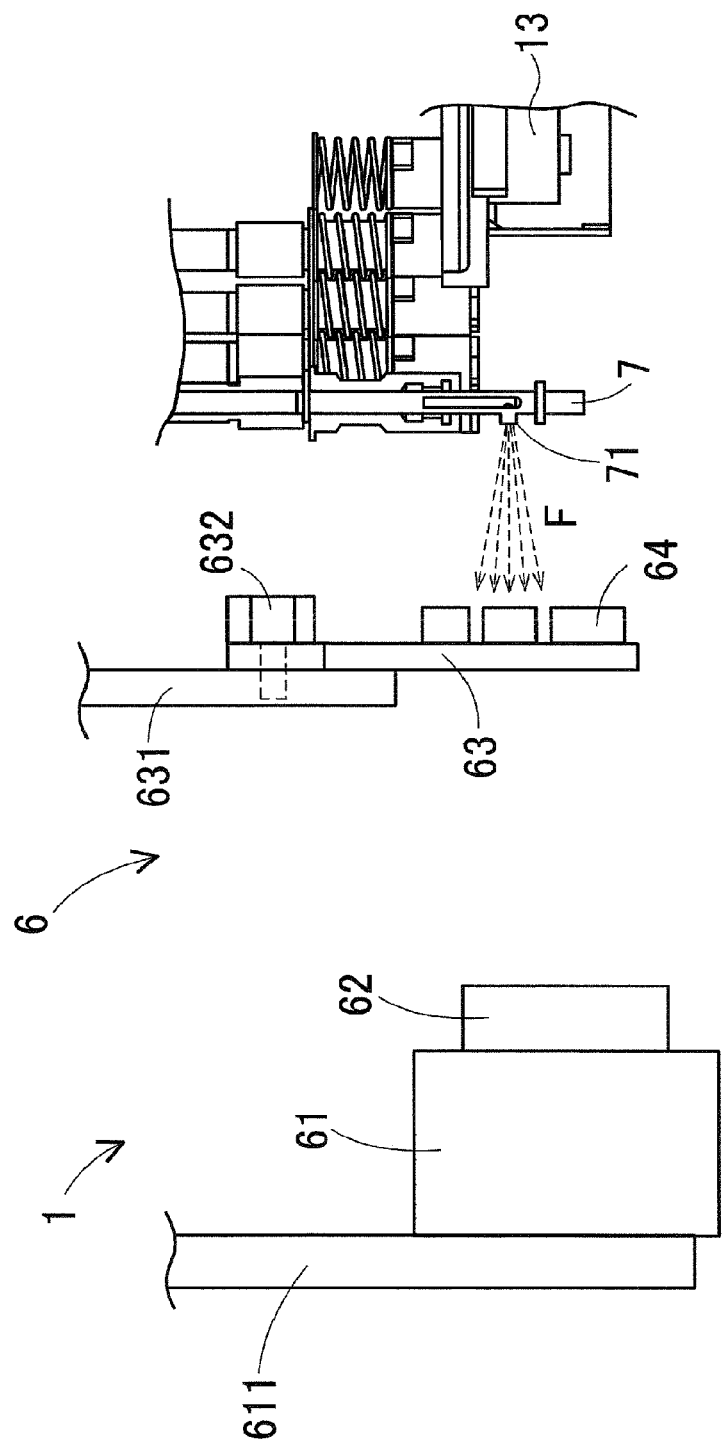
FIG. 5 is a side view from the direction of arrow B in FIG. 3.

The detailed configuration of component transfer device 1 according to the embodiment will be described. FIG. 2 is a plan view illustrating nozzle holder 13 and side imaging section 6 of component transfer device 1 according to an embodiment. FIG. 2 shows a state in which side imaging section 6 images suction nozzle 14 and the component P. FIG. 3 is a plan view showing nozzle holder 13, side imaging section 6, and cleaning nozzle 7 of component transfer device 1. FIG. 3 shows a state in which cleaning nozzle 7 is automatically cleaning side imaging section 6. Further, FIG. 4 is a view from the arrow A direction of FIG. 3, and FIG. 5 is a side view from the arrow B direction of FIG. 3.

As shown in FIG. 2, nozzle holder 13 is detachably equipped with twenty-four suction nozzles 14 arranged in a circular shape. Nozzle holder 13 is driven by an R-axis drive mechanism (not shown) to rotate about central axis 15. As a result, the multiple suction nozzles 14 move circumferentially in order to the operation position 16. The suction nozzle 14 at operation position 16 is driven to move up and down by a Z-axis drive mechanism (not shown), and is lowered to the suction height and mounting height of the component P, and is raised to the moving height when moving horizontally. Further, the suction nozzle 14 at operation position 16 is driven by a θ-axis drive mechanism (not shown) to rotate so as to adjust the direction of the held component P. In FIG. 2, a component P held by the suction nozzle 14 at operation position 16 is illustrated.

Side imaging section 6 is disposed opposite to operation position 16. Side imaging section 6 includes camera section 61 and imaging board section 63. Camera section 61 is fixed to support member 611 extending downward from mounting head 12. Camera section 61 has image detection section 62 on the front side, in which a large number of pixels are arranged in a two-dimensional grid pattern. As shown in FIG. 4, imaging board section 63 is a plate-like member that is long laterally when viewed from the front. Imaging board section 63 is fixed to support plate 631 extending downward from mounting head 12 by two fastening screws 632. Imaging board section 63 is positioned between operation position 16 and camera section 61. Imaging board section 63 has lighting section 64 and three light path sections (65, 66, and 67) for imaging.

Lighting section 64 is provided on a side surface of imaging board section 63 facing operation position 16. Lighting section 64 includes 14 LED lamps. The power supply line of lighting section 64 is wired using support plate 631. Lighting section 64 emits light toward suction nozzle 14 at operation position 16 and the component P held by the suction nozzle 14.

Between the fourteen LED lamps of lighting section 64, center light path section 65, right light path section 66, and left light path section 67 are arranged apart from each other. The light path sections (65, 66, and 67) are substantially rectangular windows formed in imaging board section 63. Transparent glass is fitted into the light path sections (65, 66, and 67). Center light path section 65 is located on a straight line connecting operation position 16 and camera section 61. Right light path section 66 is located on the right side of central light path section 65 when viewed from camera section 61. Left light path section 67 is located on the left side of center light path section 65 when viewed from camera section 61. Right light path section 66 and left light path section 67 are positioned slightly lower than center light path section 65.

Right prism 68 is provided on a side of right light path section 66 facing camera section 61. Right prism 68 has a function of refracting an image passing through right light path section 66 toward camera section 61. Similarly, left prism 69 is provided on a side of left light path section 67 facing camera section 61. Left prism 69 has a function of refracting an image passing through left light path section 67 toward camera section 61.

As indicated by arrow G1 in FIG. 2, an image obtained by viewing suction nozzle 14 and the component P at operation position 16 from the front side passes through center light path section 65 and reaches the center of image detection section 62. Also, as indicated by arrow G2, an image when suction nozzle 14 and component P are viewed obliquely rightward passes through right side light path section 66, is refracted by right prism 68, and reaches the right side of image detection portion 62. Further, as shown by arrow G3, an image when suction nozzle 14 and component P are viewed obliquely from the left direction passes through left light path section 67, is refracted by left prism 69, and reaches the left side of image detection portion 62. As a result, image detection unit 62 can capture an image of suction nozzle 14 and component P viewed from three directions at a time when acquiring image data.

When component transfer device 1 repeats the pickup of component P and mounting on board K, dust gradually adheres to light path sections 65, 66, and 67 of imaging board section 63 and lighting section 64. Cleaning nozzle 7 is used to automatically clean dust adhering to imaging board section 63. Cleaning nozzle 7 is loaded on the nozzle changer during the mounting operation of components P. Cleaning nozzle 7 is exchanged with one of the suction nozzles 14 to be mounted on nozzle holder 13.

As shown in FIGS. 3 to 5, cleaning nozzle 7 is a substantially cylindrical member elongated in the vertical direction. Cleaning nozzle 7 is closed at the lower end and the upper end of cleaning nozzle 7 is connected to first nozzle-side air passage 88A described below. Cleaning nozzle 7 has emission port 71 open only at a side surface and which opens toward side imaging section 6. Positive pressure air is supplied to cleaning nozzle 7 and emitted from emission port 71.

Figure 6:
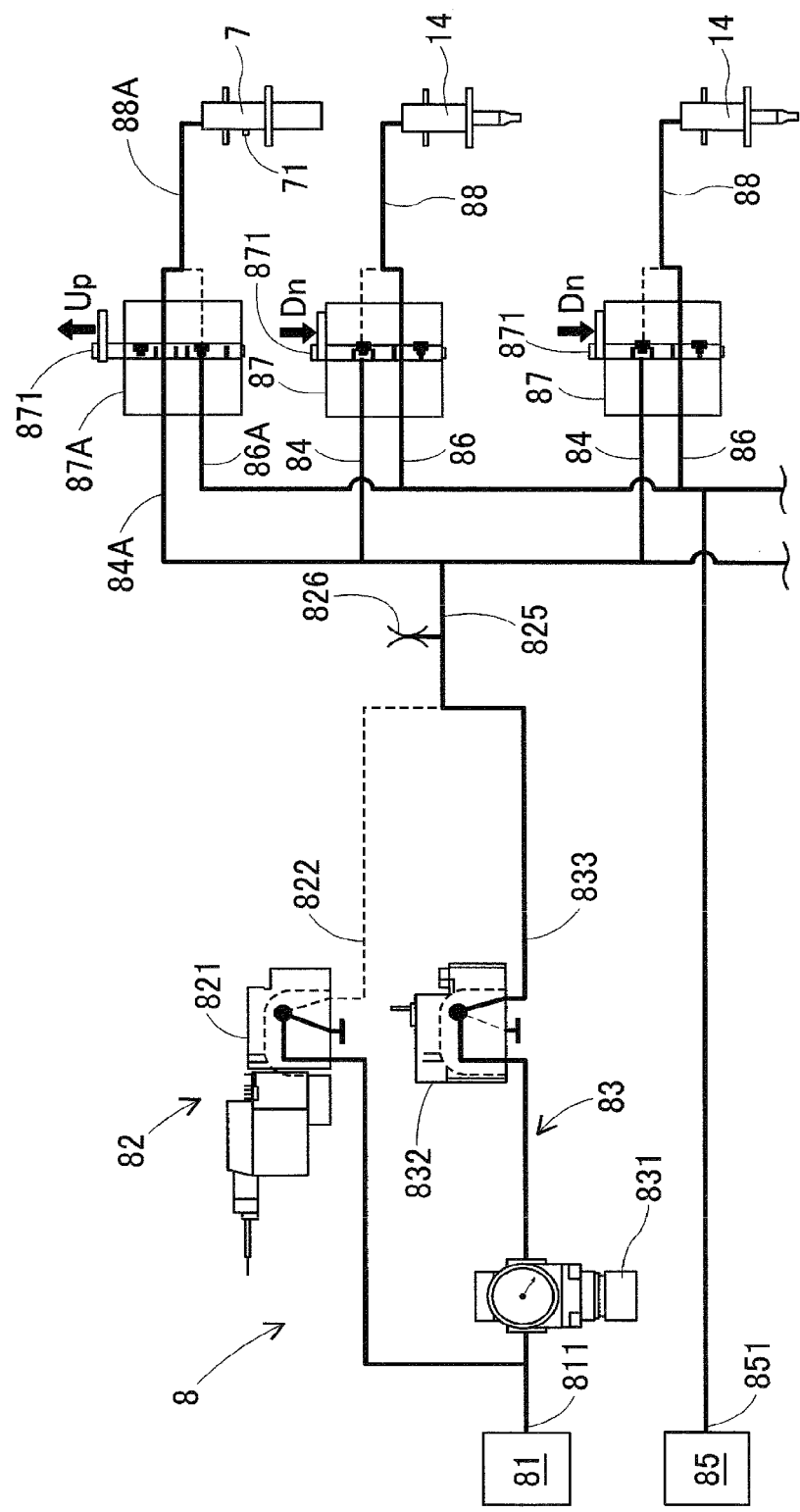
FIG. 6 shows an air supply system for supplying positive pressure air and negative pressure air to a suction nozzle.

Next, positive pressure air supply section 8 for supplying positive pressure air to cleaning nozzle 7 will be described. FIG. 6 shows an air supply system for supplying positive pressure air and negative pressure air to suction nozzle 14. In FIG. 6, an open state of air passages is indicated by a thick solid line, and a blocked state is indicated by a broken line. FIG. 6 illustrates a situation in which positive pressure low pressure air is supplied to cleaning nozzle 7. At least one of high pressure air supply section 82 and low pressure air supply section 83 shown in FIG. 6 also functions as positive pressure air supply section 8.

More specifically, air supply system includes positive pressure air source 81, high pressure air supply section 82, low pressure air supply section 83, multiple positive pressure air passages 84, negative pressure air source 85, multiple negative pressure air passages 86, multiple mechanical air valves 87, multiple nozzle-side air passages 88, and the like. The number of positive pressure air passages 84, negative pressure air passages 86, air valves 87, and nozzle-side air passages 88 is twenty-four, which is equal to the number of suction nozzles 14 to be attached, with three being shown in FIG. 6. Control section 5 also serves as an air control unit for controlling high pressure air supply section 82, low pressure air supply section 83, and air valve 87.

Positive pressure air source 81 and negative pressure air source 85 are formed, for example, on the discharge side and the suction side of an air pump (not shown). The pressure of the positive pressure air stored in positive pressure air source 81 may be, for example, 0.5 MPa, and negative pressure close to a vacuum may be used as the pressure of the negative pressure air stored in negative pressure air source 85. Supply port 811 of positive pressure air source 81 is connected to high pressure air supply section 82 and low pressure air supply section 83. That is, the high-pressure air supply section 82 and the low-pressure air supply section 83 are connected in parallel to the positive pressure air source 81. Supply port 851 of negative pressure air source 85 is branched and is connected with the multiple negative pressure air passages 86.

High pressure air supply section 82 is configured by high pressure solenoid valve 821. High pressure solenoid valve 821 opens and closes the air passage under the control of control section 5. In the open state, high pressure solenoid valve 821 causes high pressure air corresponding to the pressure of positive pressure air source 81 to flow out of outlet 822. High pressure solenoid valve 821 does not allow high pressure air to flow out in the closed state. FIG. 6 illustrates the closed state of high pressure solenoid valve 821.

Low pressure air supply section 83 is configured by a series connection of regulator 831 and low pressure solenoid valve 832. Regulator 831 reduces the air pressure of positive pressure air source 81 and discharges positive low pressure air. Low pressure solenoid valve 832 opens and closes air passages under the control of control section 5. In the open state, low pressure solenoid valve 832 allows low pressure air to flow out of outlet 833. Low pressure solenoid valve 832 does not allow low pressure air to escape in the closed state. FIG. 6 illustrates the open state of low pressure solenoid valve 832.

Outlet 822 of high pressure solenoid valve 821 and outlet 833 of low pressure solenoid valve 832 are connected to common air passage 825. Atmosphere opening valve 826 is provided at a midpoint of common air passage 825. Atmosphere opening valve 826 is a check valve that operates when common air passage 825, which maintains a positive pressure during normal operation, is in a negative pressure state. Atmosphere opening valve 826 introduces the atmosphere and eliminates the negative pressure in common air passage 825. Common air passage 825 is branched to be connected to the multiple positive pressure air passages 84.

Positive pressure air passage 84 and negative pressure air passage 86 are respectively connected to the inflow sides of the multiple air valves 87. The multiple air valves 87 are each connected to a nozzle-side air passage 88 on the outflow side. Air valve 87 has spool 871 for switching the connection state of the air passage under the control of control section 5. As shown by the Up arrow in FIG. 6, when spool 871 is raised, air valve 87 connects positive pressure air passage 84 and nozzle side air passage 88. As shown by the Dn arrow in FIG. 6, when spool 871 is lowered, air valve 87 connects negative pressure air passage 86 and nozzle-side air passage 88. Further, when spool 871 is operated to an intermediate height, air valve 87 is shut off.

Each of the multiple nozzle-side air passages 88 is connected to the interior of an attached suction nozzle 14. In FIG. 6, the first suction nozzle 14 has been exchanged for cleaning nozzle 7. Therefore, the air supply system has the same system configuration with respect to the cleaning nozzle 7 as that to suction nozzle 14. That is, cleaning nozzle 7 is connected to first air valve 87A by first nozzle-side air passage 88A. Further, first air valve 87 A is connected to positive pressure air supply section 8 by first positive pressure air passage 84A. First air valve 87A is connected to negative pressure air source 85 by first negative pressure air passage 86A.

High pressure air supply section 82 operates when suction nozzle 14 is cleaned, and supplies relatively high pressure positive pressure air to the inside of suction nozzle 14. As a result, dust accumulated in suction nozzle 14, the component suction port, or the like is blown away. On the other hand, low pressure air supply section 83 operates during normal mounting operation to supply relatively low pressure positive pressure air to the inside of suction nozzle 14. As a result, suction nozzle 14 can release a held component P to mount the component on board K or discard it.

3. Operation of Component Transfer Device 1 of the Embodiment

Figure 7:
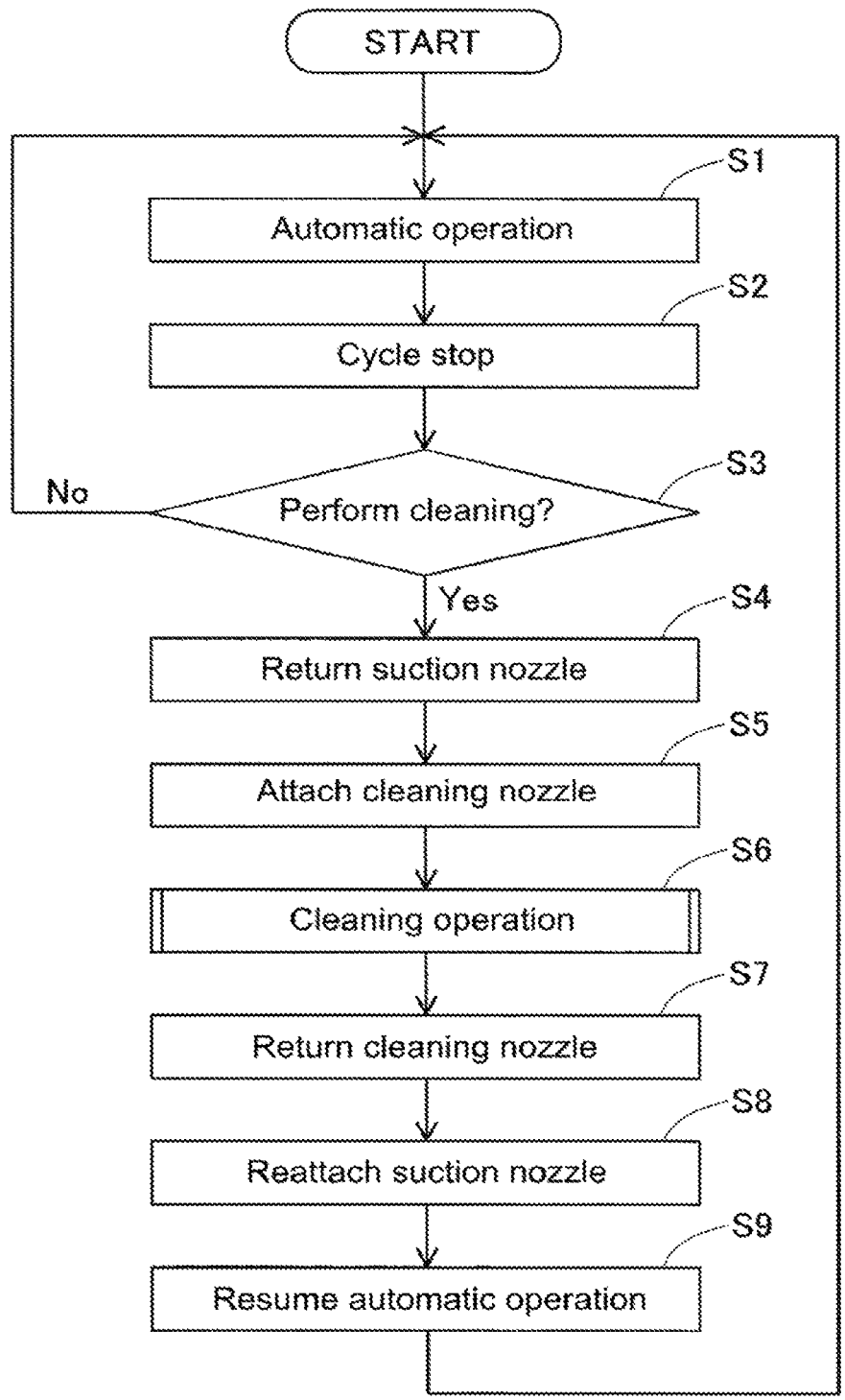
FIG. 7 shows an operation flow of a component transfer device which operates mainly by control from a control unit.
Figure 8:
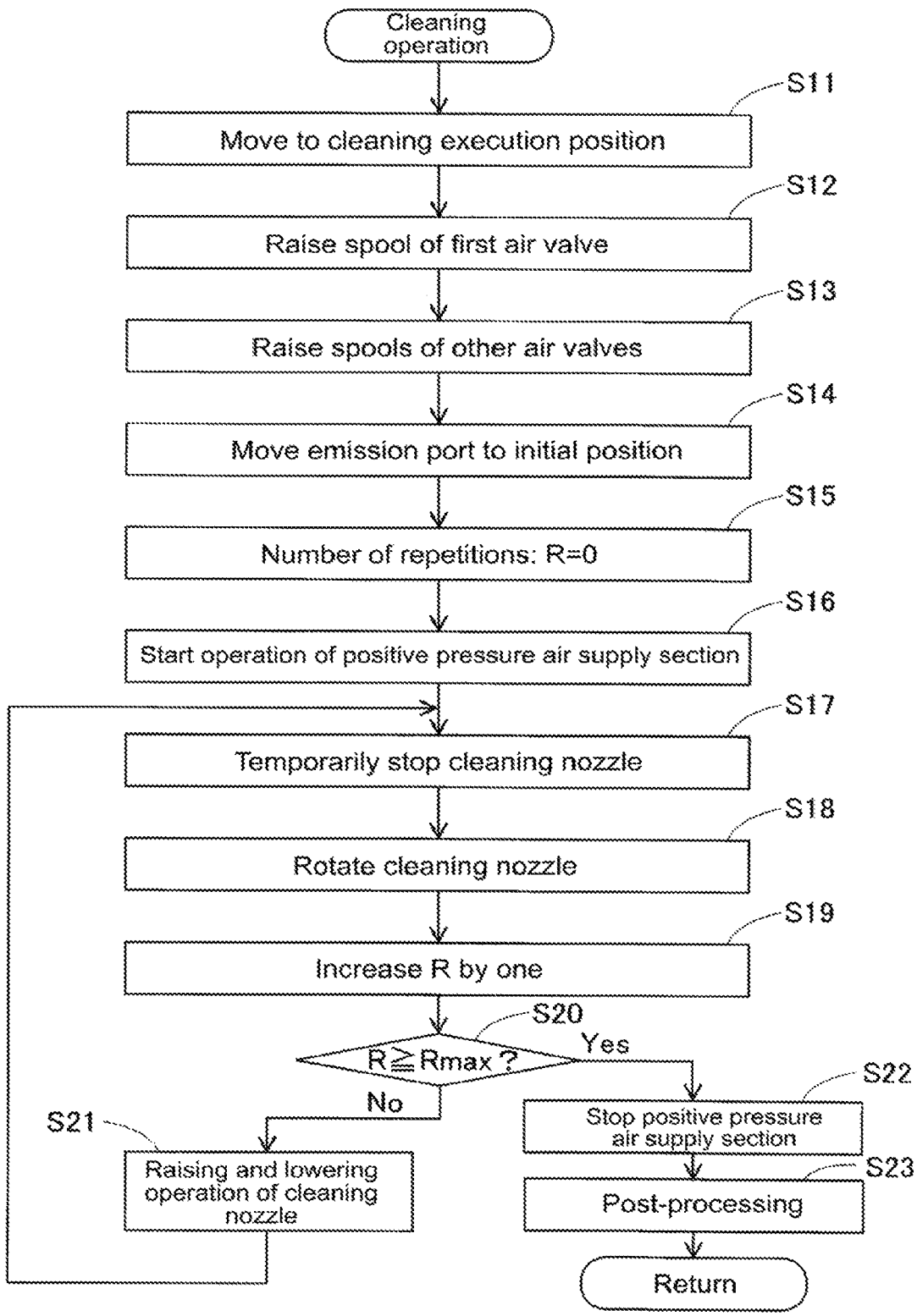
FIG. 8 illustrates a detailed operation flow of the cleaning operation of step S6.

Next, operation of component transfer device 1 according to the embodiment will be described. FIG. 7 shows an operation flow of component transfer device 1 that mainly operates under the control of control section 5. FIG. 8 shows a detailed operation flow of the cleaning operation in step S6 of FIG. 7. In S1 of FIG. 7, component transfer device 1 performs a pickup and mounting cycle by automatic operation. When one pickup and mounting cycle is completed, in S2, component transfer device 1 stops the cycle.

In the next step, S3, control section 5 determines whether to perform cleaning of side imaging section 6. Performing of cleaning is set to at least one of manual or automatic. In the case of the manual setting, an operator inputs a cleaning command via input section 51 when it is time to perform cleaning. Alternatively, before it is time to perform cleaning, the operator may reserve and set a time to perform cleaning via input section 51. In the case of the automatic setting, control section 5 determines that cleaning should be performed when the elapsed time from the previous cleaning reaches a predetermined time or when the number of parts mounted since the previous cleaning reaches a predetermined number. If cleaning is not to be performed, control section 5 returns processing to S1, and repeats the pickup and mounting cycle by automatic operation. When the cleaning is performed, control section 5 proceeds to S4.

In S4, control section 5 returns all the suction nozzles 14 mounted on nozzle holders 13 to the nozzle changer. As shown in FIG. 5, by removing suction nozzles 14 from nozzle holders 13, it is possible to prevent dust scattered during cleaning from adhering to suction nozzles 14. However, the configuration is not limited to this, and control section 5 may return only the first suction nozzle 14 to the nozzle changer, as shown in FIG. 6. In the next step, S5, control section 5 causes the cleaning nozzle 7 to be attached at the position of the nozzle holder 13 where the first suction nozzle 14 was attached. In the next step, S6, control section 5 controls the cleaning operation of the side imaging section 6.

In step S11 of FIG. 8 that shows details of the cleaning operation, control section 5 moves mounting head 12 and nozzle holder 13 to the cleaning execution position. The cleaning execution position is not particularly limited, but it is preferable to be a position for which any scattered dust has a small impact. In the next step, S12, control section 5 raises spool 871 of first air valve 87A. As a result, as illustrated in FIG. 6, cleaning nozzle 7 is connected to positive pressure air supply section 8. In the next step, S13, controller 5 lowers spool 871 of air valves 87 other than the first air valve 87A to a lower or an intermediate height.

In the next step, S14, control section 5 moves emission port 71 of cleaning nozzle 7 to the initial position. In the present embodiment, the initial position is determined such that the emission port 71 is directly opposed to an upper section of center light path section 65. In S15, control section 5 sets the number of repetitions R of the cleaning operation to 0. In S16, control section 5 starts the operation of positive pressure air supply section 8. Then, as shown by the five broken line arrows F in FIGS. 3 and 5, positive pressure air is blown out of emission port 71 of cleaning nozzle 7 toward center light path section 65. As a result, the cleaning of imaging board section 63 is started.

When only high pressure air supply section 82 is operated as positive pressure air supply section 8, high pressure air is blown out from emission port 71. As shown in FIG. 6, when only low pressure air supply section 83 is operated as positive pressure air supply section 8, low pressure air is blown out from emission port 71. Therefore, according to the present embodiment, the strength of the positive pressure air blown out for cleaning can be selected. It is also possible to operate both high pressure air supply section 82 and low pressure air supply section 83.

In the next step, S17, cleaning nozzle 7 is temporarily stopped at the initial position for a predetermined period of time prior to the rotation operation and the raising and lowering operation which will be described next. As a result, center light path section 65, which has a large influence on the quality of the image data, is intensively cleaned. In the next step, S18, control section 5 controls the θ-axis drive mechanism to rotate cleaning nozzle 7. Specifically, control section 5 first rotates cleaning nozzle 7 by angle Q in the counterclockwise direction in FIG. 3, then rotates cleaning nozzle 7 in the clockwise direction by twice the angle Q, and finally rotates cleaning nozzle 7 in the counterclockwise direction by the angle Q.

Angle Q is set so that the cleaning execution range is appropriate in consideration of the width dimension of imaging board section 63 and the arrangement of the light path sections (65, 66, and 67). It is preferable that the rotation speed of the cleaning nozzle 7 is a level lower than the rotation speed of suction nozzle 14 with which mounting operation is normally performed. As a result, a certain amount of time is required for cleaning, but imaging board section 63 is sufficiently cleaned.

In S19, after emission port 71 has returned to the initial position, control section 5 increases the number of repetitions R by one. In the next step, S20, control section 5 determines whether the number of repetitions R has reached the predetermined number of times Rmax. In the present embodiment, the predetermined number of times Rmax is set to four. Since the number of repetitions is R=1 when S20 has been performed once, control section 5 proceeds to S21.

In S21, control section 5 controls the Z-axis drive mechanism to move cleaning nozzle 7 up and down. More specifically, control section 5 lowers cleaning nozzle 7 by lowering distance H. The size of lowering distance H is set so that the cleaning execution range becomes appropriate with three lowering operations, in consideration of the height dimension of imaging board section 63 and the arrangement of the light path sections (65, 66, and 67). Next, control section 5 returns processing to S16. When the loop from S16 to S21 has been repeated three times, and steps S16 to S19 have been completed four times, the number of repetitions R=4. Therefore, when S20 is performed for the fourth time, control section 5 proceeds to S22. In S22, control section 5 stops positive pressure air supply section 8. In S23, control section 5 executes post-processing, and returns processing to S7 in FIG. 7. For example, control section 5 raises spool 871 that had been lowered as post-processing.

The blowing direction of emission port 71, that is, the position of imaging board section 63 that emission port 71 is facing, moves as indicated by dashed-line arrow C in FIG. 4. The blowing direction of emission port 71 covers substantially the entire width direction of imaging board section 63, and the three light path sections (65, 66, and 67) and the majority of lighting section 64 in height direction. Positive pressure air blown out from emission port 71 blows off the dust adhering to imaging board section 63, and cleaning is performed automatically. In addition, blind spots that are not cleaned do not occur in the light path sections (65, 66, and 67).

In S7 of FIG. 7, control section 5 performs control for returning cleaning nozzle 7 to the nozzle changer, then ends the cleaning. In the next step, S8, control section 5 performs control to reattach all the suction nozzles 14 returned to the nozzle changer to the nozzle holders 13. In the next step, S9, control section 5 resumes automatic operation and returns processing to S1. Control section 5 may determine the resumption of automatic operation by itself, or an operator may be required to confirm the cleaning state and input a resumption command via input section 51.

4. Forms and Effects of Component Transfer Device 1 of an Embodiment

Component transfer device 1 of the embodiment includes: a component mounting tool (suction nozzle 14) mounted on movable mounting head 12, the component mounting tool being configured to collect a component P from component supply device 3 and mount the component on board K; side imaging section 6 configured to image the component P held by the component mounting tool from the side; cleaning nozzle 7 having emission port 71 on a side surface only of the cleaning nozzle 7 that opens toward side imaging section 6; and positive pressure air supply section 8 configured to supply positive pressure air to cleaning nozzle 7 and blow out the positive pressure air from emission port 71 toward side imaging section 6.

Accordingly, positive pressure air supply section 8 blows positive pressure air from emission port 71 of cleaning nozzle 7 toward side imaging section 6. Since the blown positive pressure air blows off the dust adhering to side imaging section 6, the cleaning of side imaging section 6 is performed automatically. Therefore, maintenance work required to manually clean side imaging section 6 is reduced. Further, since the quality of image data acquired by side imaging section 6 is maintained at a high level, the occurrence of image processing errors is curtailed.

Furthermore, at least one of cleaning nozzle 7 and mounting head 12 performs a rotation operation and a raising and lowering operation in a state where positive pressure air is supplied to cleaning nozzle 7. Accordingly, since the blowing direction of the blowing port 71 moves, a wide range of side imaging section 6 is cleaned.

Further, side imaging section 6 includes lighting section 64 configured to illuminate the component P during imaging and a light path section (center light path unit 65, right light path unit 66, and left light path unit 67) that connects the component P and image detection unit 62, and at least one of cleaning nozzle 7 and mounting head 12 temporarily stops or decelerates at least one of a rotation speed and a raising and lowering speed at a position where emission port 71 faces light path section 65 at least one of a start timing, an intermediate timing, and an end timing of the rotation operation and the raising and lowering operation. Accordingly, center light path section 65, which has a large influence on the quality of the image data, is intensively cleaned.

Further, the component mounting tool is a suction nozzle 14 that is detachably mounted to nozzle holder 13 of mounting head 12 and that picks up component P, and cleaning nozzle 7 is exchanged with a suction nozzle 14 and mounted on mounting head 12. This eliminates the need for a dedicated member such as a mounting seat for mounting cleaning nozzle 7, simplifies the configuration of the device, and curtails an increase in the cost of the device.

Further, at least one of high pressure air supply section 82 configured to supply positive pressure air with a relatively high pressure to clean suction nozzle 14 and low pressure air supply section 83 configured to supply positive pressure air with a relatively low pressure to release the component held by suction nozzle 14 also serves as positive pressure air supply section 8. This eliminates the need to provide the dedicated positive pressure air supply section 8 for cleaning, thereby simplifying the configuration of the apparatus and curtailing an increase in the cost of the device. Also, the strength of the positive pressure air blown out for cleaning can be selected.

The component transfer device 1 further includes: multiple suction nozzles 14 detachably mounted on nozzle holders 13 of mounting head 12; multiple positive pressure air passages 84 and multiple nozzle-side air passages 88 individually connecting the multiple suction nozzles 14 and positive pressure air supply section 8; multiple air valves 87 respectively disposed in the multiple positive pressure air passages 84 and performing opening and closing operation independently of each other; and an air control section (control section 5) configured to control positive pressure air supply section 8 and the multiple air valves 87. Cleaning nozzle 7 is mounted on mounting head 12 by being exchanged with a first suction nozzle 14, and the air control section is configured to operate positive pressure air supply section 8 after opening first air valve 87A disposed in first positive pressure air passage 84A connecting positive pressure air supply section 8 and cleaning nozzle 7, and closing the air valves 87 other than the first air valve 87A. Accordingly, a cleaning function of side imaging section 6 can be provided simply by adding cleaning nozzle 7 to a component transfer device with a conventional configuration.

5. Applications and Alternative Embodiments

In an embodiment above, emission port 71 of cleaning nozzle 7 is temporarily stopped at a position facing center light path section 65, but the configuration is not limited thereto. That is, emission port 71 may be temporarily stopped at a position facing right light path section 66 or left light path section 67. Further, emission port 71 may be not temporarily stopped at a position opposed to the light path section (65, 66, and 67), but may have its rotation speed slowed. Further, in an embodiment above, cleaning nozzle 7 is rotated and lowered, but the configuration is not limited thereto. For example, in a state in which positive pressure air is supplied to cleaning nozzle 7, the entire nozzle holder 13 or mounting head 12 may perform a raising and lowering operation and rotation operation around center axis 15.

Further, a support member separate from nozzle holder 13 may be provided on mounting head 12 to support cleaning nozzle 7, and positive pressure air may be supplied to cleaning nozzle 7 through a different route from that of suction nozzle 14. Further, in a configuration in which a clamping type mounting tool is mounted on the mounting head, it is also possible to exchange the clamping type mounting tool with cleaning nozzle 7. Various other applications and modifications are possible for the configuration and operation of an embodiment.

REFERENCE SIGNS LIST

1: component transfer device;
12: mounting head;
13: nozzle holder;
14: suction nozzle;
2: board conveyance device;
3: component supply device;
4: component camera;
5: control section;
6: side imaging section;
62: image detection section;
63: imaging board section;
64: lighting section;
65: center light path section;
66: right light path section;
67: left light path section;
7: cleaning nozzle;
71: emission port;
8: positive pressure air supply section;
82: high pressure air supply section;
83: low pressure air supply section;
84: positive pressure air passage;
84A: first positive pressure air passage;
87: air valve;
87A: first air valve;
88: nozzle-side air passage;
88A: first nozzle-side air passage;
9: component mounter

The invention claimed is:

1. A component transfer device comprising:
    a suction nozzle detachably mounted on a movable mounting head, the suction nozzle configured to pick up a component from a component supply device and mount the component on a board;
    a side imaging section configured to image the component held by the suction nozzle from the side, the side imaging section including a camera;
    a cleaning nozzle having an emission port on a side surface only of the cleaning nozzle that opens toward the side imaging section, the cleaning nozzle is configured to be exchanged with the suction nozzle and to be mounted on the mounting head; and
    a positive pressure air supply section configured to supply positive pressure air to the cleaning nozzle and blow out the positive pressure air from the emission port toward the side imaging section.

2. The component transfer device according to claim 1, wherein
    at least one of the cleaning nozzle and the mounting head performs a rotation operation and a raising and lowering operation in a state in which the positive pressure air is being supplied to the cleaning nozzle.

3. The component transfer device according to claim 2, wherein
    the side imaging section includes a lighting section configured to illuminate the component during imaging and a light path section that connects the component and the camera, and at least one of the cleaning nozzle and the mounting head temporarily stops or decelerates at least one of a rotation speed and a raising and lowering speed at a position where the emission port faces the light path section at least one of a start timing, an intermediate timing, and an end timing of the rotation operation and the raising and lowering operation.

4. The component transfer device according to claim 1, wherein
    at least one of a high pressure air supply section configured to supply positive pressure air with a relatively high pressure to clean the suction nozzle and a low pressure air supply section configured to supply positive pressure air with a relatively low pressure to release the component held by the suction nozzle also serves as the positive pressure air supply section.

5. The component transfer device according to claim 1, further comprising:
    multiple of the suction nozzles detachably mounted on the mounting head;

multiple air passages individually connecting the multiple suction nozzles and the positive pressure air supply section;

multiple air valves respectively disposed in the multiple air passages and performing opening and closing operation independently of each other; and an air control section configured to control the positive pressure air supply section and the multiple air valves, the air control section including a processor, wherein the cleaning nozzle is mounted on the mounting head by being exchanged with a first suction nozzle, and the air control section is configured to operate the positive pressure air supply section after opening a first air valve disposed in a first air passage connecting the positive pressure air supply section and the cleaning nozzle, and closing the air valves other than the first air valve.

* * * * *